United States Patent
Su

(10) Patent No.: US 8,400,341 B2
(45) Date of Patent: Mar. 19, 2013

(54) NON-UNIFORM SAMPLING TECHNIQUE USING A VOLTAGE CONTROLLED OSCILLATOR

(75) Inventor: David Kuochieh Su, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 143 days.

(21) Appl. No.: 13/040,142

(22) Filed: Mar. 3, 2011

(65) Prior Publication Data

US 2012/0223850 A1 Sep. 6, 2012

(51) Int. Cl.
*H03M 1/12* (2006.01)
(52) U.S. Cl. .................................................. 341/157
(58) Field of Classification Search .................. 341/155, 341/157
See application file for complete search history.

(56) References Cited

U.S. PATENT DOCUMENTS

| | | | |
|---|---|---|---|
| 5,369,404 A * | 11/1994 | Galton | 341/143 |
| 6,762,703 B1 | 7/2004 | Tabatabaei | |
| 7,403,875 B2 | 7/2008 | Vogel et al. | |
| 7,545,306 B2 | 6/2009 | Frederick et al. | |
| 7,728,631 B2 | 6/2010 | Nathawad | |
| 2009/0091486 A1 | 4/2009 | Wiesbauer et al. | |
| 2011/0273210 A1* | 11/2011 | Nagaraj | 327/159 |
| 2012/0194369 A1* | 8/2012 | Galton et al. | 341/120 |

OTHER PUBLICATIONS

Galton, Analog-Input Digital Phase-Locked Loops for Precise Frequency and Phase Demodulation, IEEE Transactions on Circuits and Systems-11: Analog and Digital Signal Processing, vol. 42, No. IO, Oct. 1995 pp. 621-630.*

Huff, W. et al., Nonuniform-To-Uniform Decimation for Delta-Sigma Frequency-To-Digital Conversion, Proceedings of the 1998 IEEE International Symposium on Circuits and Systems, 1998. ISCAS '98, May 31-Jun. 3, 1998, vol. 1 pp. 365-368.*

Sharifkhani M., A Frequency Digitizer Based on the Continuous Time Phase Domain Noise Shaping, Proceedings of the 2004 International Symposium on Circuits and Systems, 2004, ISCAS '04, May 23-26, 2004, vol. 1 pp. I-1060-I-1063.*

Sharifkhani, M. A Phase-Domain 2nd-Order Continuous Time As-Modulator for Frequency Digitization, Proceedings. 2006 IEEE International Symposium on Circuits and Systems, 2006, ISCAS 2006, May 21-24, 2006 pp. 3434-3437.*

International Search Report and Written Opinion—PCT/US2012/026807—ISA/EPO—Jun. 22, 2012.

Khan, et al., "Implementation of Non-uniform Sampling for 'Alias-free Processing' in Digital Control", United Kingdom Automatic Control Council—Proceedings, 2008, 6 pages.

* cited by examiner

*Primary Examiner* — Howard Williams
(74) *Attorney, Agent, or Firm* — Mahamedi Paradice Kreisman LLP

(57) ABSTRACT

A data converter circuit includes a non-uniform sampling circuit and a resampler circuit. The non-uniform sampling circuit includes a sampling voltage-controlled oscillator (VCO) having an input to receive an analog data signal and having an output to generate a quantized data signal, wherein the quantized data signal comprises a plurality of non-uniform transition intervals indicative of data contained in the analog data signal. The resampling circuit has an input to receive the quantized data signal and is configured to reconstruct the data from the quantized data signal. For some embodiments, the data converter can also include a PLL that includes a feedback VCO having matched components with the sampling VCO.

19 Claims, 6 Drawing Sheets

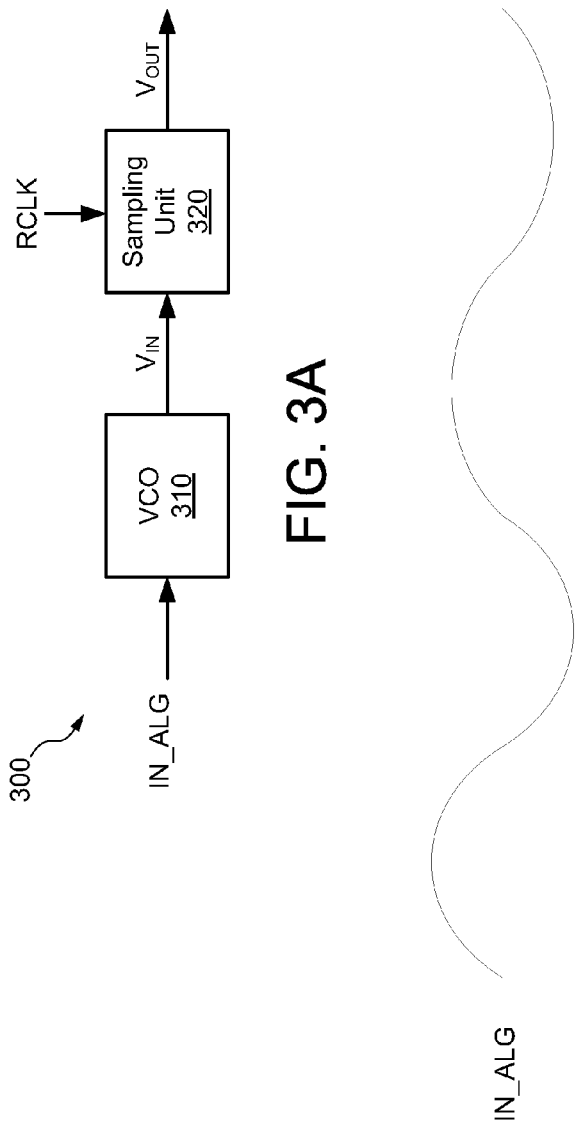
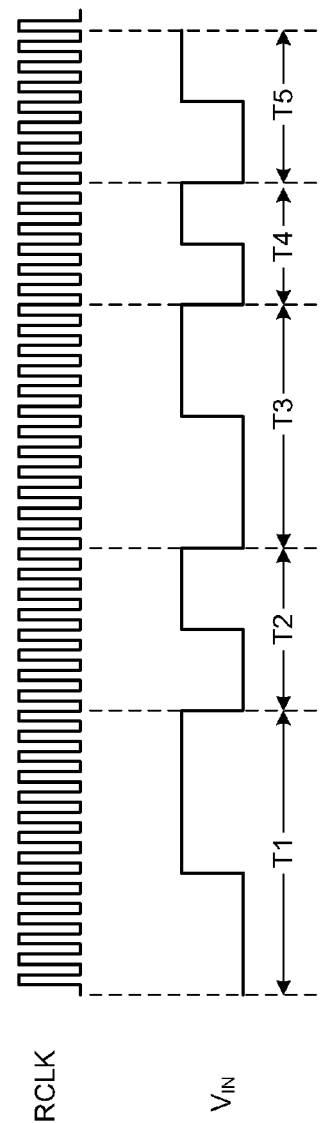
FIG. 3A
FIG. 3B

NON-UNIFORM SAMPLING TECHNIQUE USING A VOLTAGE CONTROLLED OSCILLATOR

TECHNICAL FIELD

The present embodiments relate generally to analog to digital conversion, and specifically relate to non-uniform sampling techniques.

BACKGROUND OF RELATED ART

Wireless communication systems may transfer data between a transmitter and one or more receivers. The operation of wireless communication systems may be governed, for example, by standards such as the IEEE 802.11 family of standards. Receivers in a wireless communication system typically use one or more analog-to-digital converters (ADCs) to convert a received analog signal to a digital signal that may be processed to recover the transmitted data.

Techniques for sampling a received analog signal typically fall into one of two categories: uniform sampling and non-uniform sampling. In uniform sampling approaches, the received signal is sampled at uniform time intervals using a sampling clock. For example, FIG. 1A illustrates a uniform sampler and quantizer (Q), where a time-continuous analog input signal x(t) is first low-pass filtered, and then sampled with a clock signal having a sampling period t=nT and then quantized to produce a digital output signal x[n]. Although uniform sampling techniques provide predictability in terms of sampling intervals, the Nyquist theorem calls for the sampling clock to be at least twice the highest frequency component present in the sampled signal to prevent aliasing. In practice, the analog signal first passes through an anti-alias low-pass filter to attenuate high frequency content above the half of the sampling frequency to prevent aliasing. There is hence a tradeoff between the complexity of the anti-alias low-pass filter and the sampling clock frequency. Most modern communications systems employ a sampling clock that is several times greater than the Nyquist rate to ease the anti-alias filtering requirements. Thus, one disadvantage of the uniform sampling approach is the cost and complexity of implementing an analog anti-alias filter and a high-speed sampling clock in the receiver unit.

In non-uniform sampling approaches, the received signal can be sampled in response to the signal crossing one of the discrete quantized levels, thereby minimizing sampling or quantization errors. As long as the sampler can respond fast enough to the input signal, no aliasing effect is introduced by the non-uniform sampling. However, because the quantized samples of the input signal are taken at variable intervals depending on the signal, it is necessary to keep track of precisely when each sample of the input signal is quantized to correctly reconstruct the input signal from the quantized data. For example, FIG. 1B illustrates non-uniform sampling in which the input signal x(t) is sampled and quantized in non-equidistant intervals (nT+Δt[n]), resulting in an output signal x[n]+e[n] having an ideal equidistant sampled signal x[n] and an amplitude error e[n], where e[n] represents the difference in amplitude between the uniformly sampled signal and the realistic non-uniformly sampled signal, and where Δt represents the time offset from the ideal equidistant sample period nT. FIG. 1C illustrates reconstruction of the input signal using digital techniques in which a reconstructed signal $x_r[n]$ is created from the non-uniformly sampled signal x[n]+e[n] and the known time offset Δt[n]. Reconstructing non-uniformly sampled input signals is done in the digital domain. That is, with non-uniform sampling, the analog anti-alias filter is replaced by a digital circuit that is more robust and amenable to technology scaling.

Thus, there is a need for a simpler and more area-efficient circuit that can sample input signals in a non-uniform manner, thereby alleviating the need for high-speed sampling clocks while minimizing the undesirable effects of aliasing.

BRIEF DESCRIPTION OF THE DRAWINGS

The present embodiments are illustrated by way of example and are not intended to be limited by the figures of the accompanying drawings, where:

FIG. 3A is a block diagram of a non-uniform sampling circuit in accordance with some embodiments; and FIG. 3B is an illustrative timing diagram depicting an exemplary measurement of the time intervals between edge transitions of a data signal non-uniformly sampled by the sampling circuit of FIG. 3A.

Like reference numerals refer to corresponding parts throughout the drawing figures.

DETAILED DESCRIPTION

In the following description, numerous specific details are set forth such as examples of specific components, circuits, software and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of myriad physical or logical mechanisms for communication between components.

Figure 1A:
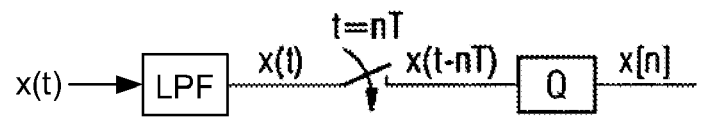
FIG. 1A depicts a conventional uniform sampling technique.
Figure 1B:
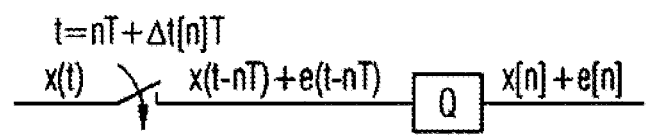
FIG. 1B depicts a conventional non-uniform sampling technique.
Figure 1C:
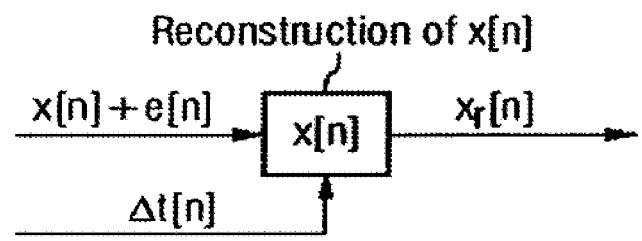
FIG. 1C depicts the reconstruction of non-uniformly sampled input signal using conventional techniques.
Figure 2:
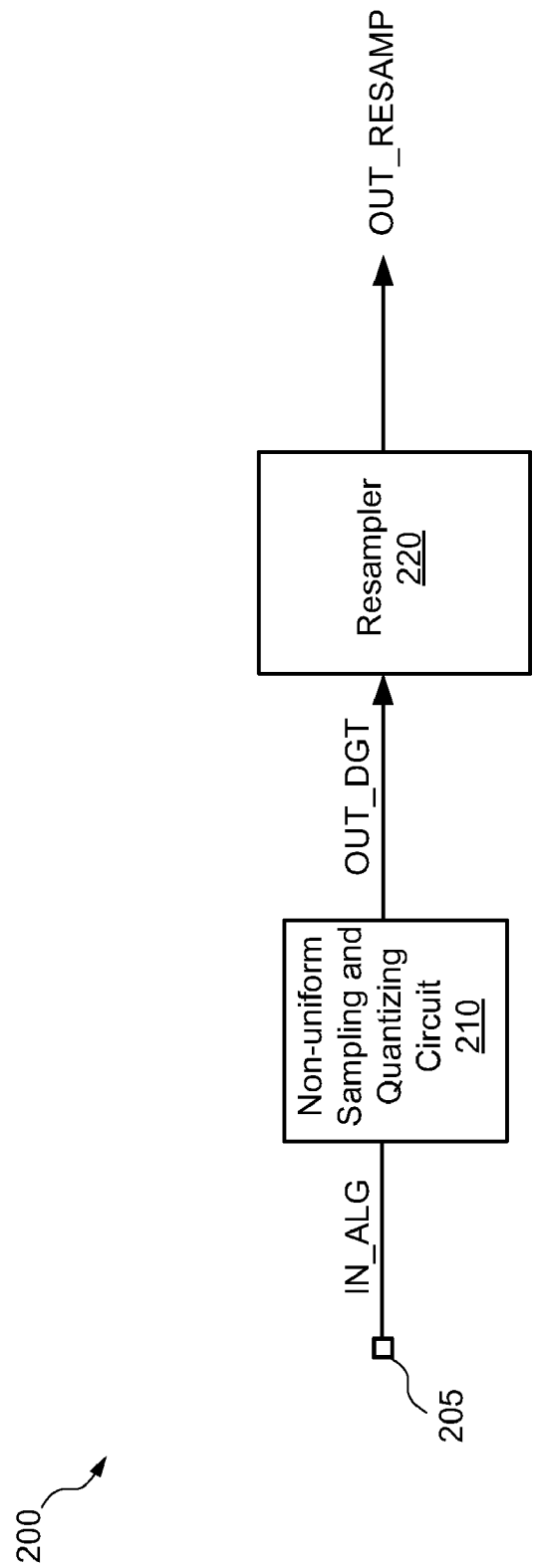
FIG. 2 is a block diagram of a non-uniform analog-to-digital converter circuit within which present embodiments can be implemented.

FIG. 2 is a block diagram of a non-uniform sampling analog-to-digital converter (ADC) 200 within which the present embodiments can be implemented. The non-uniform ADC 200 is shown in FIG. 2 to include an analog input 205, a non-uniform sampling and quantizing circuit 210, and a resampler circuit 220 that resamples the non-uniform sampled digital signal into uniform-sampled recovered data (OUT_RESAMP). For other embodiments, the analog-to-digital converter 200 can include more than one sampling circuit to support interleaving. The analog signal IN_ALG is the input signal to the non-uniform sampling circuit 210. The non-uniform sampling circuit 210 samples the input signal to generate a digital output signal OUT_DGT, which in turn is processed by the resampler circuit 220. For some embodiments, the resampler circuit 220 processes the digital signal (OUT_DGT) to reconstruct uniform-sampled data embedded in the received analog input signal IN_ALG. The recovered data may then be provided to other units (not shown for simplicity) such as a central processing unit (CPU), memory, or other circuits within and/or associated with the system. For some embodiments, the resampler circuit 220 can be a well-known data processing unit.

FIG. 3 shows an implementation of a non-uniform sampling circuit 300 configured in accordance with some embodiments. Sampling circuit 300, which is one embodiment of sampling circuit 210 of FIG. 2, is shown to include a voltage-controlled oscillator (VCO) 310 and a sampling unit 320. The VCO 310 can be implemented using a well-known oscillator circuit that generates an oscillating output signal whose phase and/or frequency varies proportionately with its input voltage. The sampling unit 320, which can be implemented using standard digital logic, includes a data input coupled to the output of the VCO 310, a clock input to receive a reference clock (RCLK), and an output to generate a quantized data signal $V_{OUT}$. More specifically, the VCO 310 has an input to receive the analog data input signal IN_ALG, and has an output to generate a signal $V_{IN}$ whose frequency varies in response to voltage fluctuations in the analog input signal IN_ALG. In this manner, the output of VCO 310 can be compared with RCLK by the sampling unit 320 in a non-uniform manner to create the quantized data signal $V_{OUT}$. For example, by converting the voltage of the input signal IN_ALG into a frequency signal $V_{IN}$ for which the time intervals between its edge transitions (e.g., T1, T2, T3, ... Tn) indicate data embedded within the input signal IN_ALG.

To reconstruct the data embedded within the quantized data signal $V_{IN}$ of FIG. 3A, a reference clock signal, with uniform frequency, is used to measure the time intervals between edge transitions in the data signal $V_{IN}$ generated by the VCO 310. More specifically, for some embodiments, the time interval between a pair of edge transitions of $V_{IN}$ can be calculated by counting the number of cycles of the reference clock (RCLK) in the corresponding transition interval of $V_{IN}$. For example, FIG. 3B depicts an illustrative waveform for an exemplary signal $V_{IN}$ generated by the VCO 310 in response to a particular IN_ALG waveform, and depicts an exemplary waveform for RCLK. The exemplary $V_{IN}$ waveform depicted in FIG. 3B is shown to include 5 periods T1-T5, each of which has a varying time interval, and thus each of the periods T1-T5 of the $V_{IN}$ waveform indicates a different data value. For example, the first period T1 has a transition interval measured by 14 cycles of RCLK, the second period T2 has a transition interval measured by 8 cycles of RCLK, the third period T3 has a transition interval measured by 12 cycles of RCLK, the fourth period T4 has a transition interval measured by 6 cycles of RCLK, and the fifth period T5 has a transition interval measured by 7 cycles of RCLK. Note that to ensure adequate precision for actual embodiments of sampling circuit 300, the frequency of RCLK should be much greater (e.g., hundreds or even thousands of times) than the frequency of output transitions of $V_{IN}$, and thus embodiments of FIG. 3A are typically used with high-speed reference clock signals to reconstruct the data from $V_{IN}$.

Figure 4:
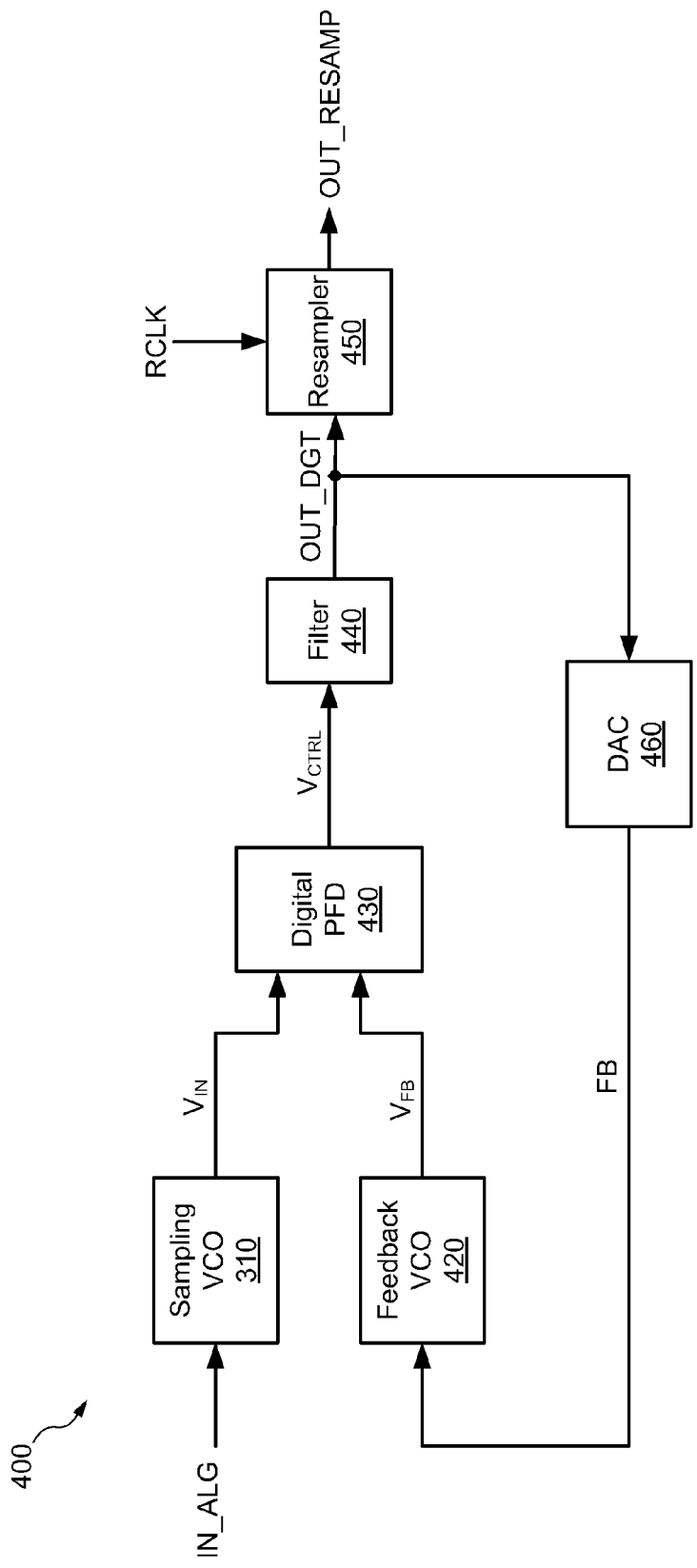
FIG. 4 is a block diagram of a non-uniform sampling circuit in accordance with some embodiments.

FIG. 4 is a non-uniform sampling circuit 400 configured in accordance with other embodiments, and typically does not need a high-speed reference clock (RCLK) to interpolate the data embodied in the non-uniformly quantized data signal $V_{IN}$. Sampling circuit 400, which is another embodiment of sampling circuit 210 of FIG. 2, is shown to include the sampling VCO 310, a feedback VCO 420, a digital phase and frequency detector (PFD) circuit 430, a digital filter circuit 440, a resampler circuit 450, and a digital-to-analog converter (DAC) 460. As described above with respect to FIG. 2, the sampling VCO 310 samples the analog input signal IN_ALG to create a quantized digital signal $V_{IN}$.

The feedback VCO 420 is an exact replica copy of the sampling VCO 310, and it generates an oscillating output feedback signal $V_{FB}$ whose phase and/or frequency can vary proportionately with its analog input feedback signal FB. For the present embodiments, the components (e.g., a inverter-based ring-oscillator or an LC resonator based oscillator) within the sampling VCO 310 and the feedback VCO 420 are matched so that their respective transfer functions are the same.

The PFD circuit 430 includes a first input to receive the quantized signal $V_{IN}$ from the sampling VCO 310, a second input to receive the output feedback signal $V_{FB}$ from the feedback VCO 420, and an output to generate a voltage control signal $V_{CTRL}$ in response to a comparison between the signals $V_{IN}$ and $V_{FB}$. More specifically, the PFD circuit 430 compares the phase and frequency of the output feedback signal $V_{FB}$ to that of the quantized data signal $V_{IN}$ to generate a digital value of $V_{CTRL}$ that indicates a phase error between $V_{IN}$ and $V_{FB}$. The implementation of digital PFD 430 is similar to that used in a digital PLL and can be implemented using a time-to-digital converter (TDC) or other equivalent techniques. The digital control signal $V_{CTRL}$ is filtered by the digital loop filter 440 to generate an output digital signal OUT_DGT that represents the quantized value of the analog data signal IN_ALG. For some embodiments, filter 440 can be implemented using well-known digital signal processing techniques. For other embodiments, filter 440 can be another type of filter (e.g., a combination of low-pass filter, band-pass filter or a high-pass filter). Optionally, the filtered output signal OUT_DGT provided by the filter 440 is re-sampled by the resampler 450 using the reference clock (RCLK) to convert the non-uniformly timed digital samples into uniformly timed samples OUT_RESAMP at the clock rate of RCLK. The resampler 450 is also implemented using well-known digital signal processing techniques, for example, including a low-pass filter, an up-sampler, and a down-sampler.

The filtered output digital signal OUT_DGT is converted from a digital signal to an analog feedback signal FB by the DAC 460, which can be implemented using well-known techniques and/or circuitry. For some embodiments, the DAC 460 can be merged or integrated into the feedback VCO 420 with adjustable bias current, bias voltage, or capacitor array. The analog feedback signal FB is provided as a control voltage to the feedback VCO 420, which in response thereto varies the frequency of oscillation of its output signal $V_{FB}$. Together, the PFD circuit 430, filter 440, DAC 460, and feedback VCO 420 form a specialized phase-locked loop (PLL) that synchronizes the feedback signal $V_{FB}$ with the quantized digital input signal $V_{IN}$ with respect to frequency and phase. More specifically, the feedback VCO 420 adjusts the phase and/or frequency of the feedback signal $V_{FB}$ in response to the phase error indicated by control voltage $V_{CTRL}$ until $V_{FB}$ is synchronized with $V_{IN}$. Due to negative feedback, the phase error is driven to a minimal value, and the phase and frequency of the feedback signal $V_{FB}$ become locked (e.g., synchronized) with the quantized input signal $V_{IN}$. If the sampling VCO 310 and the feedback VCO 420 have identical transfer functions, then IN_ALG is equivalent to OUT_DGT.

During operation of the sampling circuit 400, when the analog input signal IN_ALG varies, the frequency and phase of the quantized signal $V_{IN}$ generated by the sampling VCO 310 vary accordingly. The PFD circuit 430 adjusts $V_{CTRL}$ in response to a comparison between the quantized input signal $V_{IN}$ and the feedback signal $V_{FB}$, and the feedback VCO 420 changes the phase and frequency of its output signal $V_{FB}$ in response to $V_{CRTL}$ until $V_{FB}$ is synchronized with $V_{IN}$. Thus, when the feedback signal $V_{FB}$ generated by the feedback VCO 420 matches the quantized input signal $V_{IN}$ generated by the sampling VCO 310, phase and frequency lock is achieved, and the resulting digital output signal OUT_DGT is an accurate representation of the analog input signal IN_ALG.

Referring also to FIG. 2, the non-uniformly timed digital samples are provided as OUT_DGT to the resampler circuit 220 (e.g., the resampler circuit) to reconstruct the original data. More specifically, the resampler circuit 220 uses timing information indicative of transition intervals of $V_{IN}$ to convert the non-uniformly timed digital samples into uniformly timed samples. The resampling function may require up-sampling to a higher sampling clock, low-pass filtering the digital samples to avoid aliasing, and/or down-sampling the data to create uniformly sampled digital data. For some embodiments, the resampler circuit 220 can include a well-known digital signal processor (DSP) to interpolate the data from the non-uniform sample (e.g., using up-sampling, filtering, and down-sampling techniques).

Note that for the exemplary embodiment shown in FIG. 4, the analog input signal IN_ALG of FIG. 2 serves as the reference signal for the specialized PLL of FIG. 4, and the feedback VCO 420 adjusts the feedback signal $V_{FB}$ until the phase and frequency of $V_{FB}$ locks with the quantized input signal $V_{IN}$. In this manner, the feedback signal $V_{FB}$ chases the quantized input signal $V_{IN}$. Thus, the specialized PLL formed by the PFD circuit 430, filter 440, DAC 460, and feedback VCO 420 is different from conventional PLL circuits that synchronize a feedback signal with a reference clock signal (e.g., rather than with a quantized data signal such as $V_{IN}$). Indeed, in contrast to conventional PLL circuits, the specialized PLL circuit provided within the sampling circuit 400 of FIG. 4 uses the feedback VCO 420 to achieve phase and frequency lock with the quantized input data signal $V_{IN}$, which as described above is generated by sampling the analog input signal IN_ALG with the sampling VCO 310. Note that the DAC 460 provides an analog feedback signal FB as the control voltage to the feedback VCO 420 to maintain symmetry with the analog input signal IN_ALG provided as the control voltage to the sampling VCO 310.

Thus, in accordance with the present embodiments, the sampling VCO 310 is used as a non-uniform sampling circuit that quantizes the analog input signal IN_ALG to generate non-uniformly sampled instances represented by the signal $V_{IN}$. For some embodiments, the non-uniformly quantized signal $V_{IN}$ is a non-periodic clock waveform for which the varying intervals between its transition edges represent data quantized from the analog input signal IN_ALG. The time period between each transition in $V_{IN}$ can be measured and used (e.g., by counting the number of cycles of a uniform clock) to reconstruct data embodied by the analog input signal IN_ALG. Thus, rather than counting the number of $V_{IN}$ cycles using a sampling clock to achieve a uniform quantization of the input analog signal IN_ALG, using the VCO 310 output to count the number of cycles in a uniform clock creates sampling in a non-uniform manner so that the quantized data signal $V_{IN}$ has a varying period, thereby providing non-uniform sampling instances. The use of non-uniform sampling avoids potential aliasing effects on the input signal.

Figure 5:
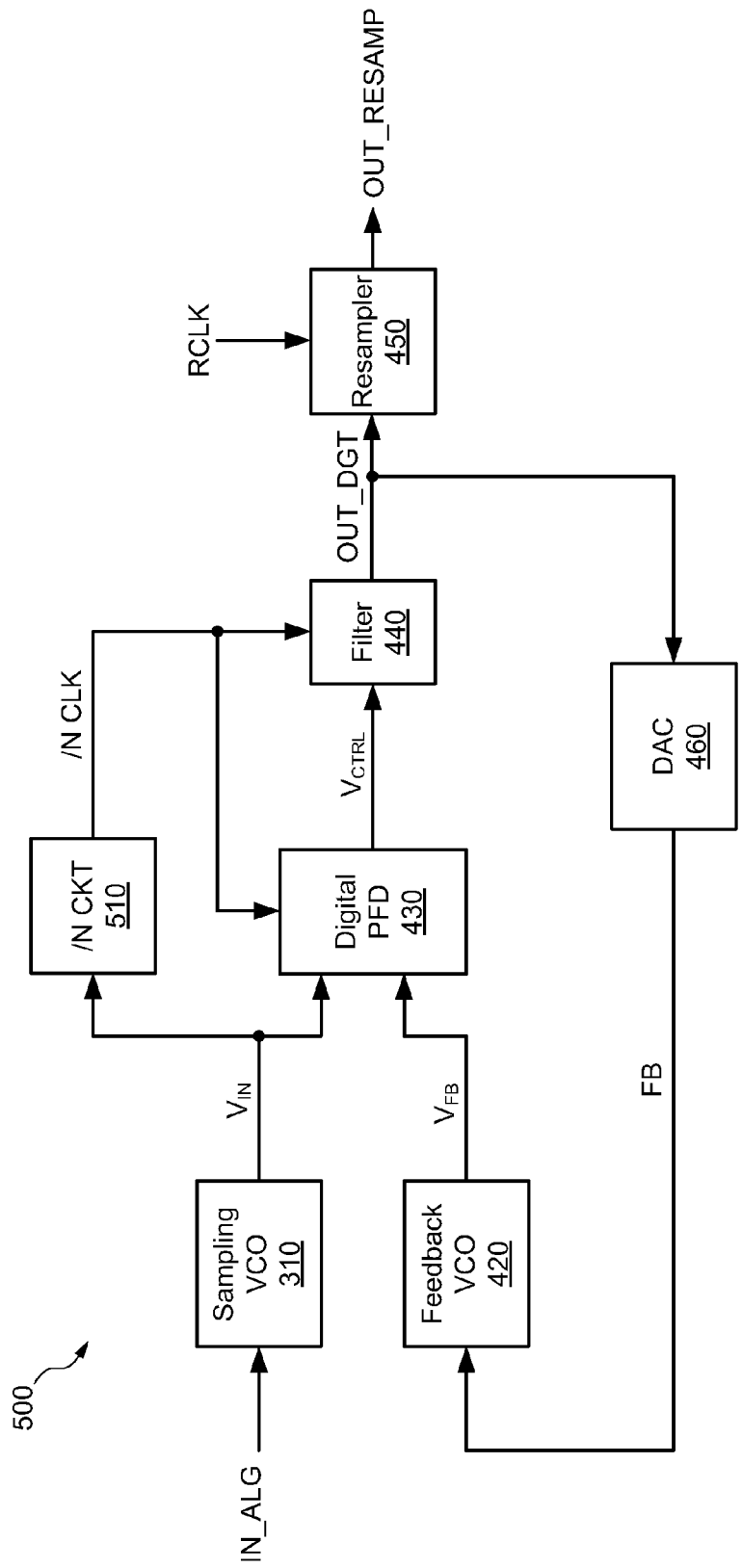
FIG. 5 is a block diagram of a non-uniform sampling circuit in accordance with other embodiments.

For other embodiments, the feedback loop of the specialized PLL can be modified to include divide-by-N circuitry. For example, FIG. 5 shows a sampling circuit 500 that is another embodiment of the sampling circuit 210 of FIG. 2. In addition to all the elements of sampling circuit 400 of FIG. 4, sampling circuit 500 includes a divide-by-N circuit 510 having an input to receive $V_{IN}$ and having an output to provide a divide-by-N clock signal (/N CLK) to the digital PFD circuit 430 and the digital filter 440. The IN circuit 510, which is well-known, is inserted into the system such that a fractional of the output signal $V_{IN}$ of the sampling VCO 310 is used to clock the PFD circuit 430 and the filter 440. Thus, for every N cycles of the VCO 310 output signal $V_{IN}$, the divide-by-N circuit 510 generates a clock cycle for clocking the PFD circuit 430 and the filter 440. The divide-by-N circuit 510 can be implemented using a divide-by-N counter if N is an integer.

Figure 6:
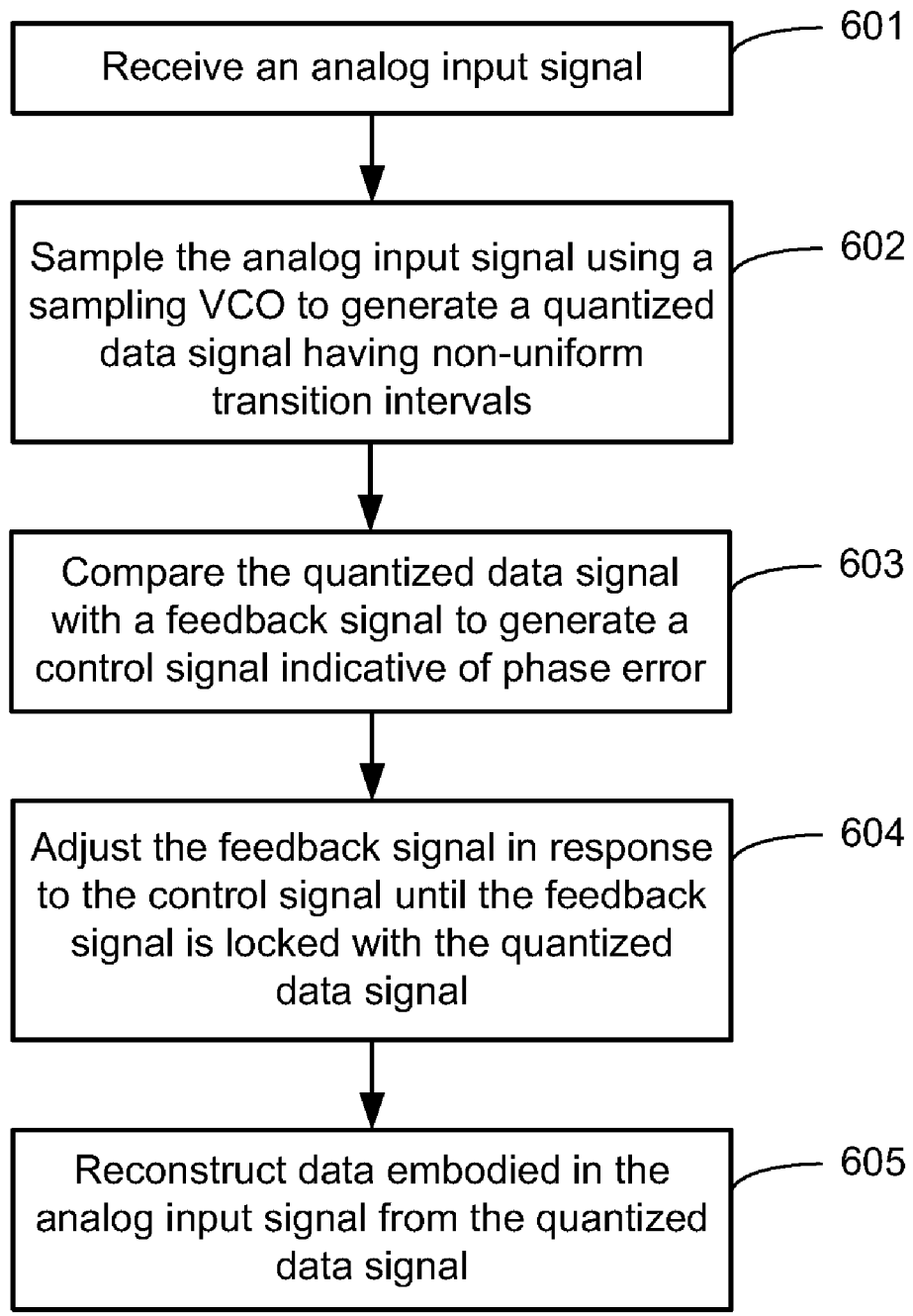
FIG. 6 is a flow chart depicting an exemplary data sampling operation in accordance with some embodiments.

FIG. 6 is an illustrative flow chart depicting an exemplary operation of one embodiment of the sampling circuit 400 of FIG. 4. First, the analog input signal is received into the sampling circuit 400 (601). Then, the analog input signal is sampled by the sampling VCO 310 to generate a quantized data signal $V_{IN}$ (602). As described above, the quantized data signal $V_{IN}$ includes a plurality of non-uniform transition intervals, wherein durations of the transition intervals are indicative of data contained in the analog data signal IN_ALG. The PFD circuit 430 compares the quantized data signal $V_{IN}$ with the feedback signal $V_{FB}$ generated by the feedback VCO 420 to generate a digital control signal $V_{CTRL}$ indicative of a phase error between the feedback signal and the quantized data signal (603). The digital control signal $V_{CTRL}$ can be filtered by the digital loop filter 440 to generate OUT_DGT and then converted to the analog feedback signal (FB) by the DAC 460. In response to the feedback signal FB, the feedback VCO 420 adjusts the frequency and/or phase of the feedback $V_{FB}$ signal until the feedback signal $V_{FB}$ is locked with the quantized data signal $V_{IN}$ generated by the sampling VCO 310 (604). Thereafter, data embodied by the quantized data signal $V_{IN}$ is reconstructed, for example, using the resampler 450 (605).

In the foregoing specification, the present embodiments have been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. A data converter circuit, comprising:
   a non-uniform sampling circuit including a sampling voltage-controlled oscillator (VCO) having an input to receive an analog data signal and having an output to generate a quantized data signal, wherein the quantized data signal comprises a plurality of non-uniform transition intervals indicative of data contained in the analog data signal; and
   a resampling circuit having an input to receive the quantized data signal and configured to reconstruct the data from the quantized data signal.

2. The data converter circuit of claim 1, further comprising a reference clock signal that is used to measure the time period of each non-uniform transition interval of the quantized data signal.

3. The data converter circuit of claim 1, wherein the non-uniform sampling circuit further comprises:
a phase-locked loop (PLL) coupled to the sampling VCO.

4. The data converter circuit of claim 3, wherein the PLL comprises:
a feedback VCO having an input to receive an input feedback signal and having an output to generate an output feedback signal;
a phase and frequency detector (PFD) circuit having a first input coupled to the output of the sampling VCO, a second input coupled to the output of the feedback VCO, and an output to generate a control signal; and
a filter circuit having an input to receive the control signal and having an output to generate a digital output signal representative of the analog data signal.

5. The data converter circuit of claim 4, further comprising:
a resampler circuit coupled to the output of the filter circuit and configured to convert non-uniformly sampled data into uniform time samples.

6. The data converter circuit of claim 4, wherein the PLL further comprises:
a digital-to-analog converter (DAC) having an input to receive the digital output signal and having an output coupled to the input of the feedback VCO.

7. The data converter circuit of claim 6, wherein the DAC is integrated within the feedback VCO.

8. The data converter circuit of claim 4, wherein the PFD circuit compares the signals output by the sampling VCO and the feedback VCO to generate the control signal.

9. A non-uniform sampling circuit, comprising:
a sampling voltage-controlled oscillator (VCO) having an input to receive an analog data signal and having an output to generate a quantized data signal, wherein the quantized data signal comprises a plurality of non-uniform transition intervals indicative of data contained in the analog data signal;
a feedback VCO having an input to receive an input feedback signal and having an output to generate an output feedback signal;
a phase and frequency detector (PFD) circuit having inputs to receive the quantized data signal and the output feedback signal, and having an output to generate a control signal; and
a filter circuit having an input to receive the control signal and having an output to generate a digital output signal representative of the analog data signal.

10. The non-uniform sampling circuit of claim 9, wherein the feedback VCO, the PFD circuit, and the filter circuit form a phase-locked loop (PLL) that locks the output feedback signal onto the quantized data signal.

11. The non-uniform sampling circuit of claim 9, further comprising:
a resampler circuit coupled to the output of the filter circuit and configured to convert non-uniform time samples into uniform time samples.

12. The non-uniform sampling circuit of claim 9, further comprising:
a digital-to-analog converter (DAC) having an input to receive the digital output signal and having an output coupled to the input of the feedback VCO.

13. The non-uniform sampling circuit of claim 9, wherein the PFD circuit compares the signals output by the sampling VCO and the feedback VCO to generate the control signal.

14. A method for sampling an analog data signal using a non-uniform sampling circuit, comprising:
receiving an analog data signal into the sampling circuit;
sampling the analog data signal in a non-uniform manner using a sampling voltage-controlled oscillator (VCO) to generate a quantized data signal;
comparing the quantized data signal with a feedback signal to generate a control signal indicative of a phase error between the feedback signal and the quantized data signal; and
adjusting a phase of the feedback signal using a feedback VCO until the feedback signal is phase locked with the quantized data signal.

15. The method of claim 14, wherein the quantized data signal comprises a plurality of non-uniform transition intervals.

16. The method of claim 15, wherein durations of the transition intervals are indicative of data contained in the analog data signal.

17. The method of claim 16, wherein the sampling VCO and the feedback VCO include matched components.

18. The method of claim 14, further comprising:
filtering the control signal to generate a digital output signal.

19. The method of claim 18, further comprising:
resampling the digital output signal in response to a clock signal.

* * * * *